United States Patent
Tellez et al.

(10) Patent No.: US 6,305,004 B1
(45) Date of Patent: Oct. 16, 2001

(54) METHOD FOR IMPROVING WIRING RELATED YIELD AND CAPACITANCE PROPERTIES OF INTEGRATED CIRCUITS BY MAZE-ROUTING

(75) Inventors: Gustavo Tellez, Cornwall on Hudson, NY (US); Gary Doyle, Jonesville, VT (US); Philip Honsinger, Poughkeepsie, NY (US); Steven Lovejoy, South Burlington, VT (US); Charles Meiley, San Jose, CA (US); Gorden Starkey, Essex Junction; Reginald Wilcox, Jr., Cambridge, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/387,062

(22) Filed: Aug. 31, 1999

(51) Int. Cl.[7] .................................................... G06F 17/50
(52) U.S. Cl. .............................................. 716/12; 716/13
(58) Field of Search ................................. 716/12, 13, 14

(56) References Cited

U.S. PATENT DOCUMENTS

| | | | |
|---|---|---|---|
| 4,615,011 | * | 9/1986 | Linsker .................................. 716/14 |
| 5,483,461 | * | 1/1996 | Lee et al. ............................... 716/13 |
| 5,644,500 | * | 7/1997 | Miura et al. ........................... 716/12 |

OTHER PUBLICATIONS

Chen, et al. "Layer Assignment for Yield Enhancement" pp. 173–180. 1995.
A. Pitaksanonkul, et al. "DTR: A Defect–Tolerant Routing Algorithm" 26th ACM/IEEE Design Automation Conference pp. 795–798. 1989 (no date).
Xue, et al. "Routing for Manufacturability" pp. 1–5.
Kuo, et al. "YOR: A Yield–Optimizing Routing Algorithm by Minimizing Critical Areas and Vias" IEEE Transactions on Computer Aided Design of Integrated Circuits and Systems. vol. 12 No. 9 Sep. 1993 (no date).
A. Venkataraman, et al. "Yield Enhanced Routing for High–Performance VLSI Designs" pp. 1–10.
Waring, et al. "Integration of DFM Techniques and Design Automation" pp. 59–67. 1996 (no date).

* cited by examiner

*Primary Examiner*—Trong Phan
(74) *Attorney, Agent, or Firm*—H. Daniel Schnurmann

(57) ABSTRACT

A method for automatically wiring (i.e., routing) an integrated circuit chip after completing the placement of cells on the chip is described. The method employs a maze routing such that the spacing between the routed wires is increased, while at the same time maintaining control over the total wiring length. The maze routing herein described is modified to improve chip yield, reduce wiring capacitance, limit power consumption and coupled signal noise, all of which are achieved by increasing wire-to-wire spacings.

10 Claims, 18 Drawing Sheets

METHOD FOR IMPROVING WIRING RELATED YIELD AND CAPACITANCE PROPERTIES OF INTEGRATED CIRCUITS BY MAZE-ROUTING

FIELD OF THE INVENTION

This invention generally relates to VLSI circuit design, and more specifically to a method for performing automatic wiring of an integrated circuit chip, module or card.

BACKGROUND OF THE INVENTION

Automatic routing of VLSI chips, modules or cards can be accomplished by a variety of methods, many of which have been known and studied for at least 20 years. It is acknowledged by practitioners that automatic routing consists of two stages: a Global Routing, which produces rough locations of wires, and a Detailed Routing, which takes the results of the global routing to generate detailed locations and layers for wiring the chip.

Automatic routing has been enhanced by taking into consideration certain relevant factors which improve the electrical characteristics of the package being wired. Some of these techniques have been described in the literature, examples of which are listed below:

S. Y. Kuo, "YOR: an yield optimizing routing algorithm by minimizing critical areas and vias," published in the IEEE Transactions on CAD, Vol. 12, No. 9, pp 1303–1311, September 1993;

Z. Chen and I. Koren, "Layer assignment for yield enhancement", IEEE International Workshop on Defect and Fault Tolerance in VLSI Systems, November 1995, pp 173–180;

Pitaksanonkul et. al., "DTR: A Defect Tolerant Routing Algorithm", Proceedings of 26st Design Automation Conference, pp 795–798, 1989;

A. Venkataraman, H. H. Chen and I. Koren, "Yield enhanced routing for high-performance VLSI designs", Proceedings of SPIE Conference on Microelectronic Manufacturing Yield, Reliability, and Failure Analysis, pp 50–60, October 1–2, 1997;

T. G. Waring, G. A. Allan and A. J. Walton, "Integration of DFM Techniques and Design Automation", Proceedings IEEE International Conference on Defect and Fault Tolerance in VLSI Systems, pp 59–67, 1996; and M. Lorenzetti, "The Effect of Channel Router Algorithms on Chip Yield," Proceedings of International Workshop on Layout Synthesis, May 1990.

A conventional Detailed Routing can be achieved by following one of two approaches:

1) Channel routing, wherein the router connects all the nets, allowing for an increase of the area taken by the wiring to achieve all the connections, and 2) Area routing, wherein the router is given a fixed area to connect all the nets.

The above listed references generally describe various methods which apply exclusively to channel routing, (as opposed to area routing). Channel routing techniques are mostly interesting as a research tool but are seldom used in practice, mainly because of the aforementioned wiring versus area tradeoff.

Within the context of area routing, attempts have been made to improve yield while wiring a chip, module, and the like. Such an approach is described in an article by:

E. P. Huijbregts, H. Xue and J. A. G. Jess, "Routing for Reliable Manufacturing", IEEE Transactions on Semiconductor Manufacturing, vol. 8, pp 188–194, 1995.

The above mentioned article by E. P. Huijbregts et al., is of particular interest since formulae are developed that measure yield effects as a function of wire length, common run length, and wiring crossing areas. These formulae are then combined with the traditional steiner tree routing objective (which is the same objective used for maze routing), using a scaled weight (or cost) proportional to the sparsity of the circuit. Using these formulae, the maze routing expansion method is modified to include the region surrounding the wire to compute the cost of the wire. Yet, the method described by E. P. Huijbregts et al. includes complex formulae to derive the weights which control the maze runner. This approach suffers from certain fundamental limitations, such as the applicability of these formulae which depend on assumptions made about the manufacturing model and the design which are not generally applicable. Further, the method requires modifying the core of the maze router, which results in a severe performance penalty.

OBJECTS OF THE INVENTION

Accordingly, it is an object of the invention to efficiently and automatically wire a VLSI integrated circuit (IC) chip or module.

It is another object of the invention to employ area routing (also referred as maze routing), wherein the router is given a fixed area to connect all the nets.

It is a more particular object of the invention to wire the chip and the like, while optimizing yield, reducing capacitance and avoiding coupled noise.

It is yet another object of the invention to maintain the maze routing unaltered by varying the weights used by the method and procedure (i.e, the cost) by which these weights are created.

It is still another object of the invention to make it possible to use any maze router without modifying its function.

It is a further object of the invention to ensure that the run time of the maze router remains constant, particularly since any time penalty is usually caused by updates to the weights.

It is still a further object of the invention to derive the maze routing weights in a systematic fashion, while accounting explicitly for the ultimate stated goal, i.e., yield improvement, as well as capacitance and/or noise reduction.

It is yet another object of the invention to employ the area routing method known as maze routing with rip-up and re-route.

BRIEF DESCRIPTION OF THE DRAWINGS

These and other objects, aspects and advantages of the invention will be better understood from the following detailed description of a preferred embodiment of the invention when taken in conjunction with the accompanying drawings, in which.

SUMMARY OF THE INVENTION

Figure 1:
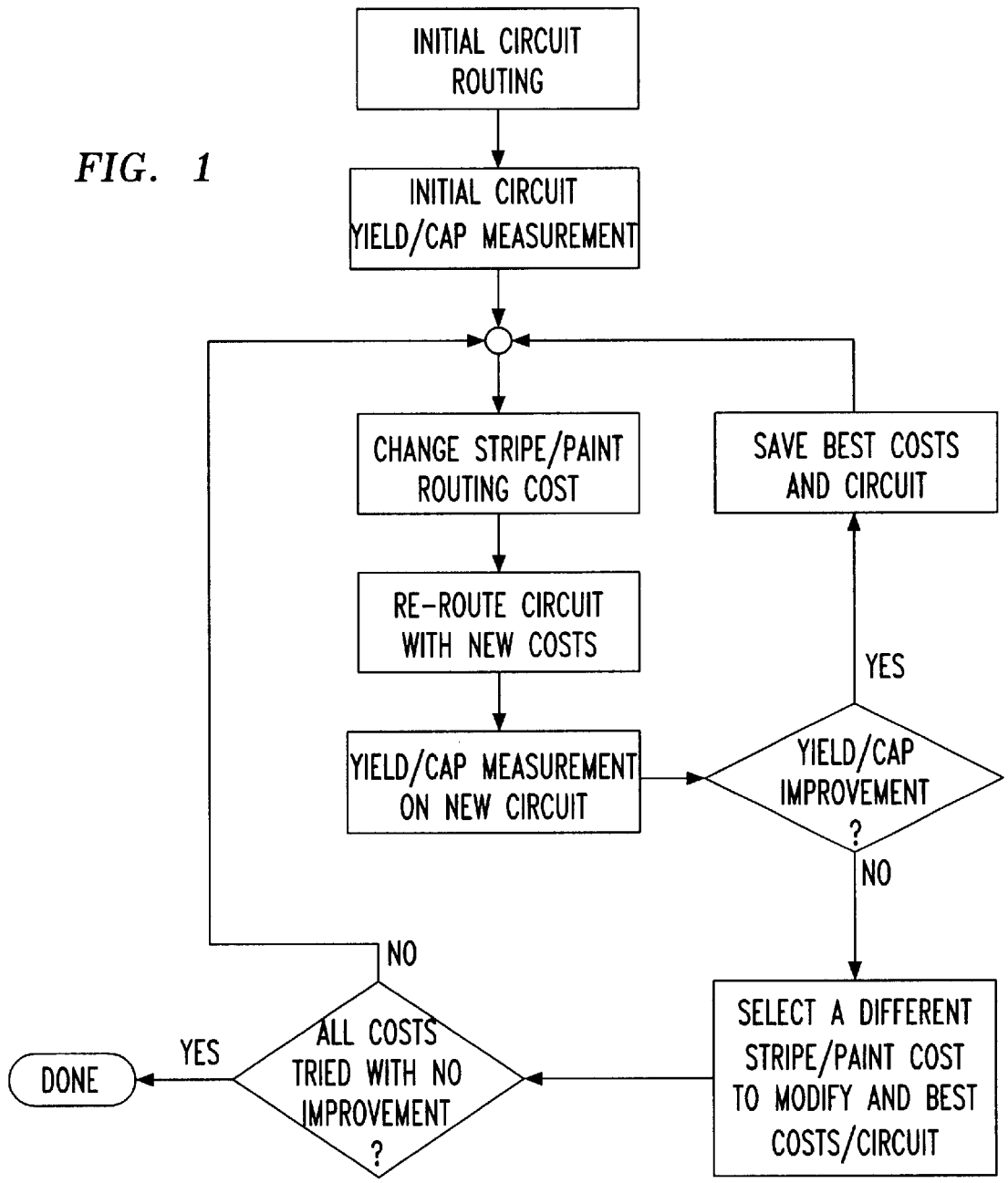
FIG. 1 shows a flow chart illustrating a method of selecting Stripe and Paint costs applicable to an integrated circuit chip or module, in accordance with the present invention.

The present invention is a method for automatically wiring (i.e., routing) an integrated circuit (IC) chip or module after completing the placement of cells or macros on the chip. The invention assumes that a routing method creates the necessary connections between modules which will correctly transmit signals from the chip output pins to input pins. The routing method described is capable of creating all the necessary connections (or nets) required for an optimum function of an integrated circuit chip. The invention specifically improves the method of maze routing so that the spacing between the routed wires is increased, while maintaining control over the total wiring length. The maze routing herein described is designed to improve yield, reduce wiring capacitance, limit power consumption and coupled signal noise by increasing wire-to-wire spacings, while appropriately trading off wire spacing increases with a wire length expansion.

The routing results generated by the inventive method are provided to some requesting entity, either by an integrated circuit designer or by a program attempting to route the IC chip and possibly optimize some of the chip's properties, such as yield, capacitance, power, and coupled noise. Thus, the inventive method is a routing utility which may also be used in other applications.

In a first aspect of the invention, there is provided a method for automatically wiring nets that personalize an integrated circuit chip, module or card while improving yield, reducing capacitance and noise coupling, the method comprising the steps of: a) converting the integrated circuit chip, module or card into a grid graph and assigning an initial cost to arcs forming the grid graph, the grid graph and the initial cost being suited to a maze router; b) applying the maze router to provide an initial routing for all the nets on the grid graph and modifying the arc costs after routing each of the nets, the modified arc cost conforming with the maze router; c) iteratively rerouting with the maze router all the nets on the grid graph and modifying the costs of the arcs until changes in the total cost of the arcs fall below a predetermined threshold; and d) repeating steps a) through c), and measuring at the end of each cycle the yield, capacitance, power, or noise coupling to determine if any further changes in the costs translate into an improvement.

DETAILED DESCRIPTION OF THE INVENTION

The inventive method of maze routing is based on the solution to a problem known by practitioners as the shortest path problem, fully described in the book by Ravindra K. Ahuja, Thomas L. Magnanti and James B. Orfin, "Network Flows. Theory, Algorithms and Applications", published by Prentice Hall, Englewood Cliffs, N.J., 1993. Solving the shortest path problem in a graph requires finding the path with the shortest distance between any two nodes in the graph. The length of the path is equal to the sum of the weights of the arcs (i.e., connections between adjacent nodes) of the path on the graph. Various solutions to the shortest path problem have been described, as for instance, Dijkstra's algorithm, Dial's algorithm, Radix Heap algorithm, and the like, all of which are well known to practitioners.

The maze routing is a specialized version of the shortest path problem solution, applied to a 3-dimensional (3-D) grid graph. In a 3-D grid graph, the legal locations of wiring and pins are modelled as a 3-D matrix with locations (x,y,z). A 3-D grid graph has an arc for every adjacent grid graph location. Two grid graph locations (x1,y1,z1) and (x1,y2,z2) are adjacent if $|x1-x2|+|y1-y2|+|z1-z2|=1$. A path between grid locations (1,1,1) and (1,1,3) is (1,1,1)→(1,1,2)→(1,1,3). The length of this path is the weight of the arc (1,1,1)→(1,1,2)+the weight of arc (1,1,2)→(1,1,3). Assuming that the weights for all arcs is 2, then the length of the illustrative path is 4. Oftentimes, a grid graph location may be blocked (i.e., blockage), so that a path is not allowed to pass through that location. The set of grid locations with the same z value is said to be a routing plane.

For each grid graph (x,y,z), there are six possible arcs making a connection with an adjacent grid location:

| | |
|---|---|
| - EAST | (x,y,z) -> (x + 1,y,z) |
| - WEST | (x,y,z) -> (x - 1,y,z) |
| - SOUTH | (x,y,z) -> (x,y - 1,z) |
| - NORTH | (x,y,z) -> (x,y + 1,z) |
| - UP | (x,y,z) -> (x,y,z + 1) |
| - DOWN | (x,y,z) -> (x,y,z - 1) |

The inventive method improves upon the method of maze routing by providing ways of selecting the arc weights in the grid graph, which result in improvements in the integrated circuit properties of interest (e.g., yield improvement, capacitance reduction, decrease of the noise, etc.).

The maze routing method operating on a given net includes the follows steps:

1) Identifying the pins of the net in question as locations on the grid graph.

2) Using the 'shortest path algorithm' to find a path that connects the locations.

3) Reporting if such a path exists. If a path does not exist, then an overflow condition is flagged.

4) Reporting a path of arcs having the shortest length.

5) Blocking the grid locations used by the reported path.

High Level View of the Invention

Referring to FIG. 1, generally, the invention consists of the following steps:

Selecting weights on the grid graph before routing (Stripe/Paint Method).

Selecting weights of the grid graph during routing (Paint Method).

Choosing Stripe and/or Paint method weights resulting in improvements of a specific IC property (e.g., yield, reduced capacitance, power, coupling noise, etc.).

Performing the routing process with the inventive method that does not give rise to net overflows.

The Stripe Method

An IC router has as a primary design goal the task of wiring the chip. This objective gives rise to assigning a preferred routing direction to each routing plane. Typically, these routing directions alternate. By way of example, plane 1 may only use EAST, WEST and UP arcs, while plane 2 may use NORTH, SOUTH and DOWN arcs. A routing track therefore consists of a set of grid points on a routing plane adjacent along a preferred routing location of that plane. Accordingly, the routing tracks are defined as follows:

If the preferred routing direction is EAST-WEST on plane z, then a horizontal routing track Y consists of all grid points located at (x, Y, z), wherein x=1, 2, . . . , Xmax;

If the preferred routing direction is NORTH-SOUTH on plane z, then a vertical routing track X consists of all grid points located at (X, y, z) wherein y=1, 2, . . . , Ymax.

The Stripe method proceeds as follows:

Stripe Step 1) Define a VIA, LOW, MEDIUM and HIGH cost (i.e., a VIA cost is the cost associated with the arcs that represent the vias which connect nets in a plane to nets on an adjacent plane).

Stripe Step 2) Assign to each of the horizontal tracks either a favored or a non-favored status, alternating in a predetermined manner between all the horizontal tracks. Repeat the same for all vertical tracks.

Stripe Step 3) For all horizontal tracks, assign a HIGH weight to all NORTH-SOUTH arcs.

Stripe Step 4) For each favored horizontal routing track, assign a LOW weight to all EAST-WEST arcs.

Stripe Step 5) For each non-favored horizontal routing track, assign a MEDIUM weight to all EAST-WEST arcs.

Stripe Step 6) For all vertical tracks, assign a HIGH weight to all EAST-WEST arcs.

Stripe Step 7) For each favored vertical routing track, assign a LOW weight to all NORTH-SOUTH arcs.

Stripe Step 8) For each non-favored vertical routing track, assign a MEDIUM weight to all NORTH-SOUTH arcs.

Stripe Step 9). Proceed with routing all the nets using the STRIPE weight assignment.

The weight assignments are such that LOW<MEDIUM<HIGH. Intuitively, this weight assignment (which determines the cost) causes the paths using favored routing tracks to have a shorter length than that using alternate tracks. To obtain an average spacing of one track between the wires, tracks are made to alternate between favored and non-favored assignments. Since the paths tend to occur on favored tracks, the average wire-to-wire spacing is one track. [Note: since the maze runner is weight-based, routing in the alternate tracks is allowed but it is expensive]. The relative expense of routing in favored and non-favored tracks depends on the relative values of LOW, MEDIUM and HIGH. The bigger the difference between these values, the higher the importance which the router will place on spacing and the lower the importance which the router will place on length. Furthermore, the value of the cost of a VIA also has an impact on the results. The higher the VIA cost, the fewer UP/DOWN paths will be created. This, typically, also increases the packing of wires in the lower planes.

The Paint Method

The Paint method consists of the following steps:

Paint Step 1) Select a VIA, LOW, MEDIUM and HIGH weight.

Paint Step 2) For all horizontal tracks, assign a HIGH weight to all NORTH-SOUTH arcs and a LOW weight to all EAST-WEST arcs.

Paint Step 3) For all vertical tracks, assign a LOW weight to all NORTH-SOUTH arcs and a HIGH weight to all EAST-WEST arcs.

Paint Step 4) For each grid location on a horizontal track adjacent to a blockage, assign a MEDIUM weight to all EAST-WEST arcs.

Paint Step 5) For each grid location on a vertical track adjacent to a blockage, assign a MEDIUM weight to all the NORTH-SOUTH arcs.

Paint Step 6) For each net:

Paint Step 6A) If the net is already routed, remove the paths of the net to insure that the locations occupied by the net remain unblocked. Then, perform Paint Steps 2) through 5) on the grid locations formerly occupied by the net.

Paint Step 6B) Route the net.

Paint Step 6C) Block the grid locations covered by the new net paths.

Paint Step 6D) Perform Paint Steps 2) through 5) on the grid locations adjacent to the new net paths.

Both, the Paint and the Stripe methods increase the average wire-to-wire spacing to one track. In the case of the Paint method, this takes place during the routing by making the area around blockages (and routed nets) to be given a high cost.

While the Stripe and Paint methods are described so that a single track increase in spacing is achieved, the methods can be altered by increasing the spacing by more than a single track. This is done by creating a weight pattern around areas where routing is not desired (alternate tracks or blockages). The weight pattern will decrease as the distance from the blockage increases.

The key to success of the Stripe and Paint methods lies in the choice of LOW, MEDIUM, HIGH, and VIA weights for each plane. Such costs are difficult to predict, even with a detailed knowledge of the chip technology and the yield/capacitance parameters. This problem is addressed by the following method for discovering good maze router weights.

Assuming that a method for measuring yield, capacitance, power, or noise coupling objective already exists, the method proceeds as follows:

Tune Step 1) Route the circuit with normal routing parameters.

Tune Step 2) Quantify a yield/capacitance objective of the routed chip.

Tune Step 3) Repeat for each routing weight (LOW, MEDIUM, HIGH, VIA) at a time:

Tune Step 3A) Repeat until no measure improvement is detected:

Tune Step 3A1) Change (increase or decrease) the selected routing weight.

Tune Step 3A2) Route using the new weight.

Tune Step 3A3) Compute measure for new routing.

Tune Step 3A4) Compare measure with the previous best result.

Tune Step 3B) Keep the circuit and cost combination which results in the best yield/capacitance measure.

While the above method is described using LOW, MEDIUM, HIGH and VIA weights, the method also applies to larger combinations of weights and selection of weights for each routing plane.

Method for Routing an Integrated Circuit with Paint or Stripe Costs, Without Overflows The Stripe and Paint methods impose certain costs on the maze router that may lead to nets which cannot be routed. This is obviously undesirable. It is likely that the costs used by a router to achieve 100% completion of net routes differs from the costs chosen for the Paint and Stripe methods. To overcome this problem, a method for routing chips is described that will improve the yield or capacitance of the circuit without causing overflows:

Route Step 1) Route the circuit using costs for 100% routing completion.

Route Step 2) If the circuit is not completely routed, then route the overflows manually (if appropriate).

Route Step 3) For each net in the circuit:

Route Step 3A) Remove (rip-up) the wires for that net (Follow Paint Step 6A when using Paint Method); and Route Step 3B) Re-route the net using Stripe or Paint costs.

The existence of a solution to the routing problem is guaranteed if the circuit is fully routed at the beginning of Route Step 3. Therefore, no overflows can be generated when using this method. Note that this method can be repeated as often as necessary or, alternatively, until no yield improvement or capacitance reduction is observed. Finally, this method can also be constrained to modify only selected nets (and, thus, critical nets such as clocks can be avoided).

The advantages of increasing spacing between wires obtained by applying the above described method are as follows:

1) Reduced likelihood of random shorts, which in turn improves circuit yield. The yield is modeled using the average critical area measure, which is equal to the summation of L/S, where L is the common run length between two adjacent wires of the routing, and S is the spacing between the adjacent wires. The smaller the average critical area results in a better IC yield.

2) Reduced wiring capacitance which improves circuit performance and reduces power consumption. The wiring capacitance can be estimated by the formula $A \times W \times L + B \times L/S^K$, where A, B and K are constants that depend on technology parameters and W is the width of the wire. The first component of this formula is the UP/DOWN parasitic capacitance of the wire. The second component of the parasitic capacitance is the lateral (wire-to-wire) capacitance. The smaller the parasitic capacitance of the interconnect, the faster the circuit will run, and the smaller the power consumption of the circuit.

3) Reduced signal coupled noise. Increasing wire-to-wire spacing decreases the wire-to-wire parasitic capacitance. This capacitance coupling is the cause for signal coupling noise. Therefore, a smaller wire-to-wire parasitic capacitance results in a reduced signal coupled noise.

ILLUSTRATIVE EXAMPLE

Figure 2:
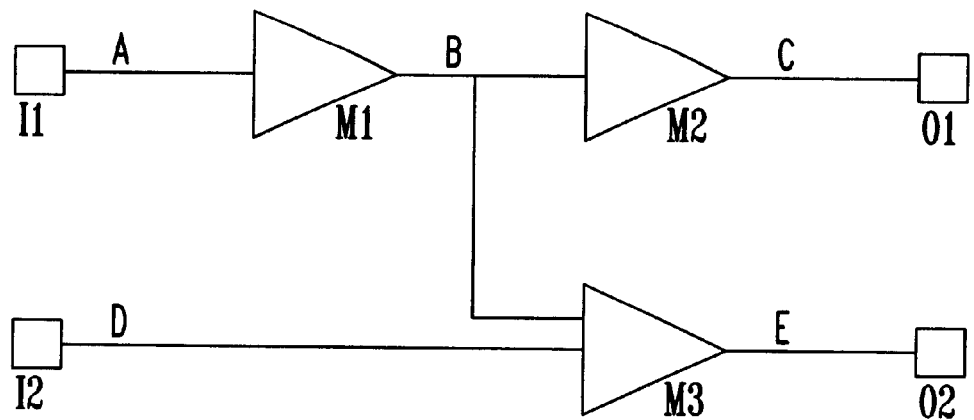
FIG. 2 shows a schematic diagram of an illustrative circuit used to explain the method of the present invention.

Referring now to FIG. 2, there is shown a schematic diagram of an IC consisting of cells M1, M2, and M3, two inputs I1 and I2, and three outputs O1, O2 and O3. The circuit consists of net A connecting I1 to M1; net B connecting M1, M2 and M3; net C connecting M2 to O1; net D connecting I2 to M3, and net E connecting M3 to O2. The circuit shown is a logic (or electrical) representation of the illustrative circuit used to describe how the cells are placed and routed.

Figure 3:
FIG. 3 is a schematic diagram of a logic to physical conversion of the circuit shown in FIG. 2.
Figure 3:

FIG. 3 shows each cell of the logic configuration converted to a physical design. The shapes depicted are required to manufacture the IC chip. They represent the locations of the pins of each cell which tell the router which of the shapes need to be connected. The physical cells are placed on the IC chip during the placement phase and subsequently wired.

Figure 4:
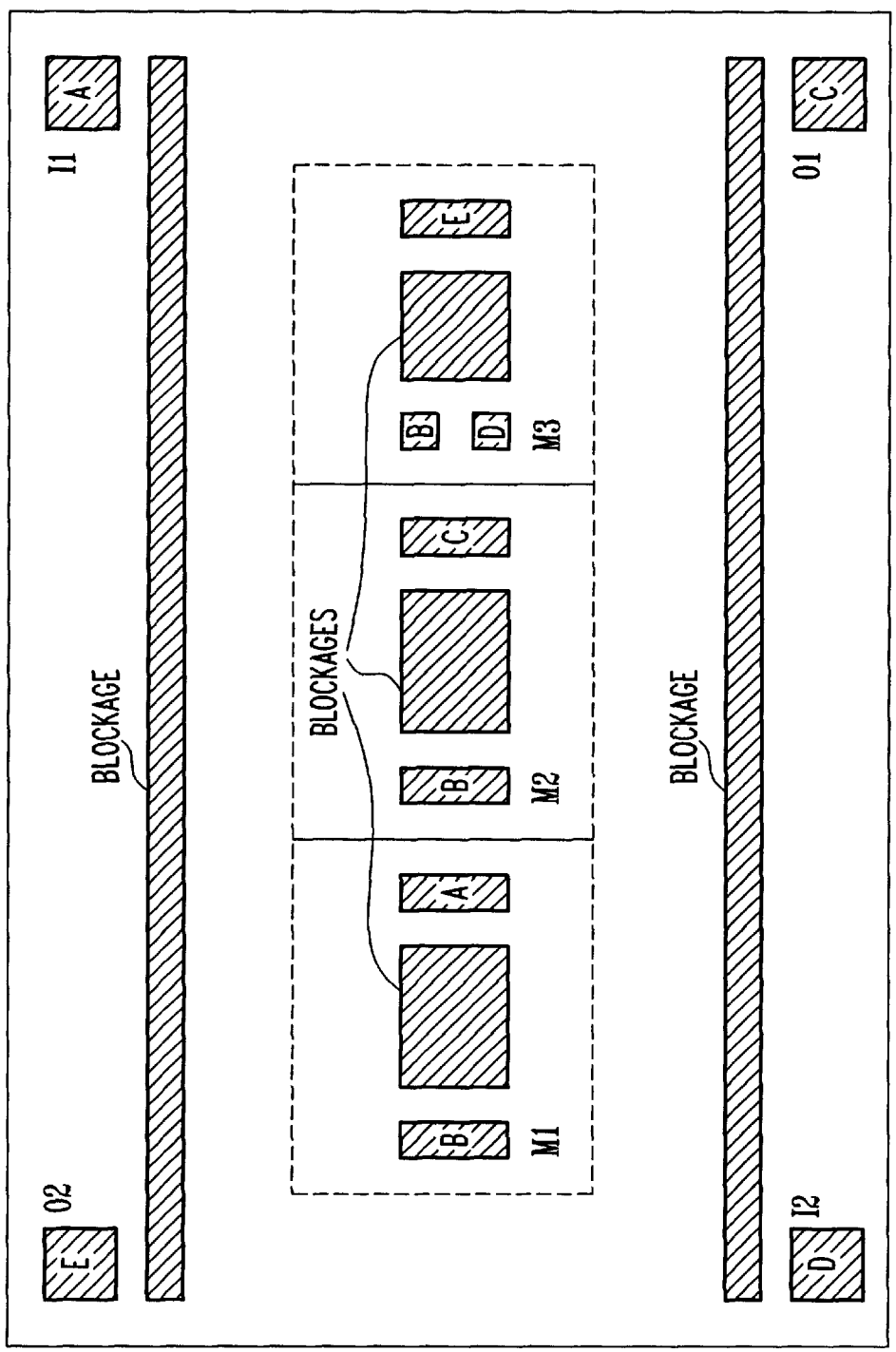
FIG. 4 is a diagram showing the placement of the cells forming the circuit when no routing has yet been performed.

FIG. 4 illustrates the placement of the cells forming the IC chip of FIG. 1. The nets are referenced by I1, I2, M1, M2, M3, O1 and O2. Nets A, B, C, D, and E are shown inside the shapes. Other shapes not belonging to the nets may be included. These are identified as blockages.

Figures 5A, 5B:
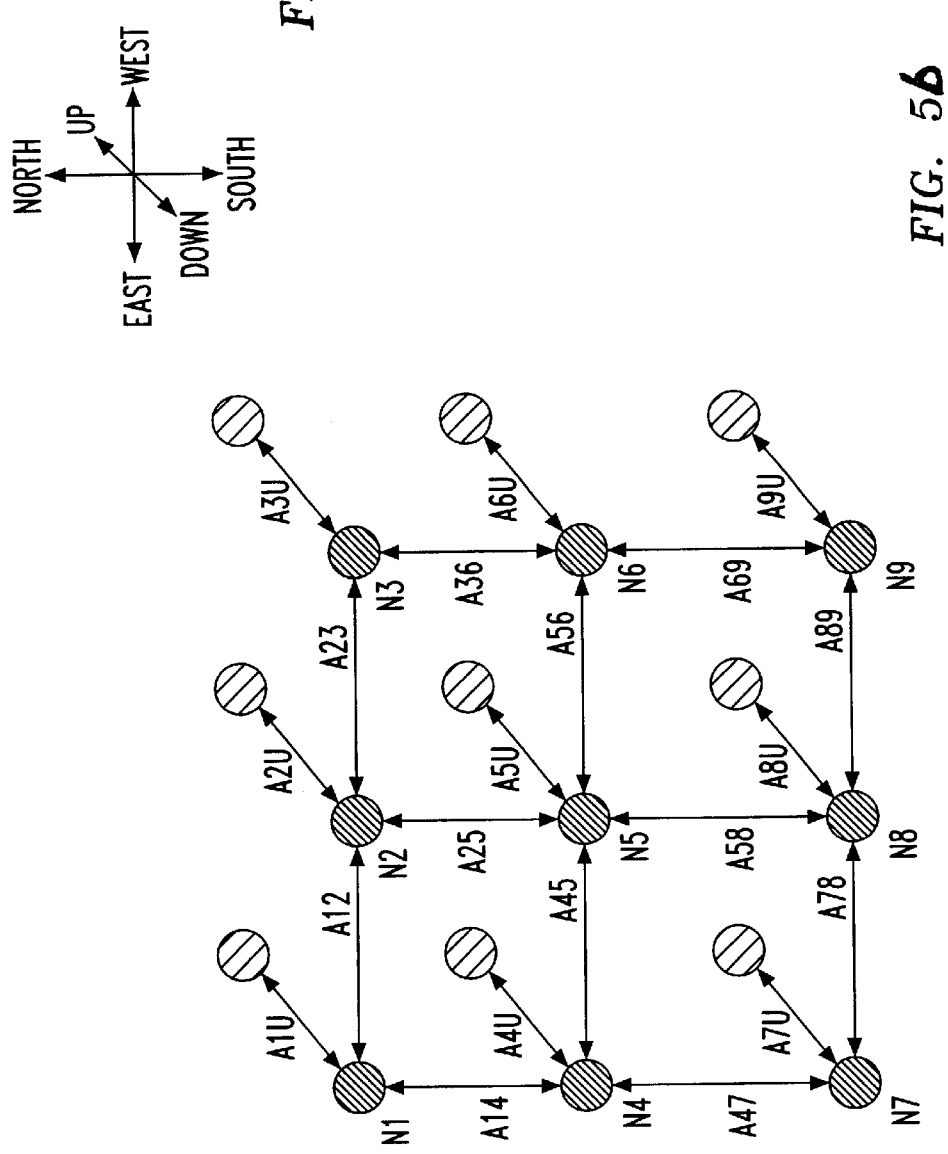
FIG. 5a shows a 3-D grid graph with two routing planes.
FIG. 5b shows the cells of the integrated circuit already placed to which a grid graph has been superimposed.

FIG. 5a shows a three-dimensional (3-D) grid graph with two routing planes. The grid nodes (i.e., locations) positioned on plane 1 are referenced N1–N9. The corresponding ones in plane 2 are depicted by a hatched representation. The arcs, illustrated as two-way arrows, are:

EAST-WEST (horizontal arcs): A12, A23, A34, A45, A56, A67, A78 and A89;

NORTH-SOUTH (vertical arcs): A14, A25, A36, A47, A69;

UP-DOWN arcs: A1U, A2U, A3U, A4U, A5U, A6U, A7U, A8U, A9U.

FIG. 5b shows the cells which have now been placed, with the grid graph superimposed over it. The nodes of the grid graph are drawn as dotted lines at the intersections of the grid. The grid arcs are represented as dotted lines between the grid nodes. In the illustrative example, two wiring planes are reserved for routing (wiring) the chip: one plane for the horizontal lines and one plane for the vertical lines. The shapes within the cells make up the blockages and/or the pins. Blockages and/or pins are represented as grid nodes touching a shape.

Figure 6:
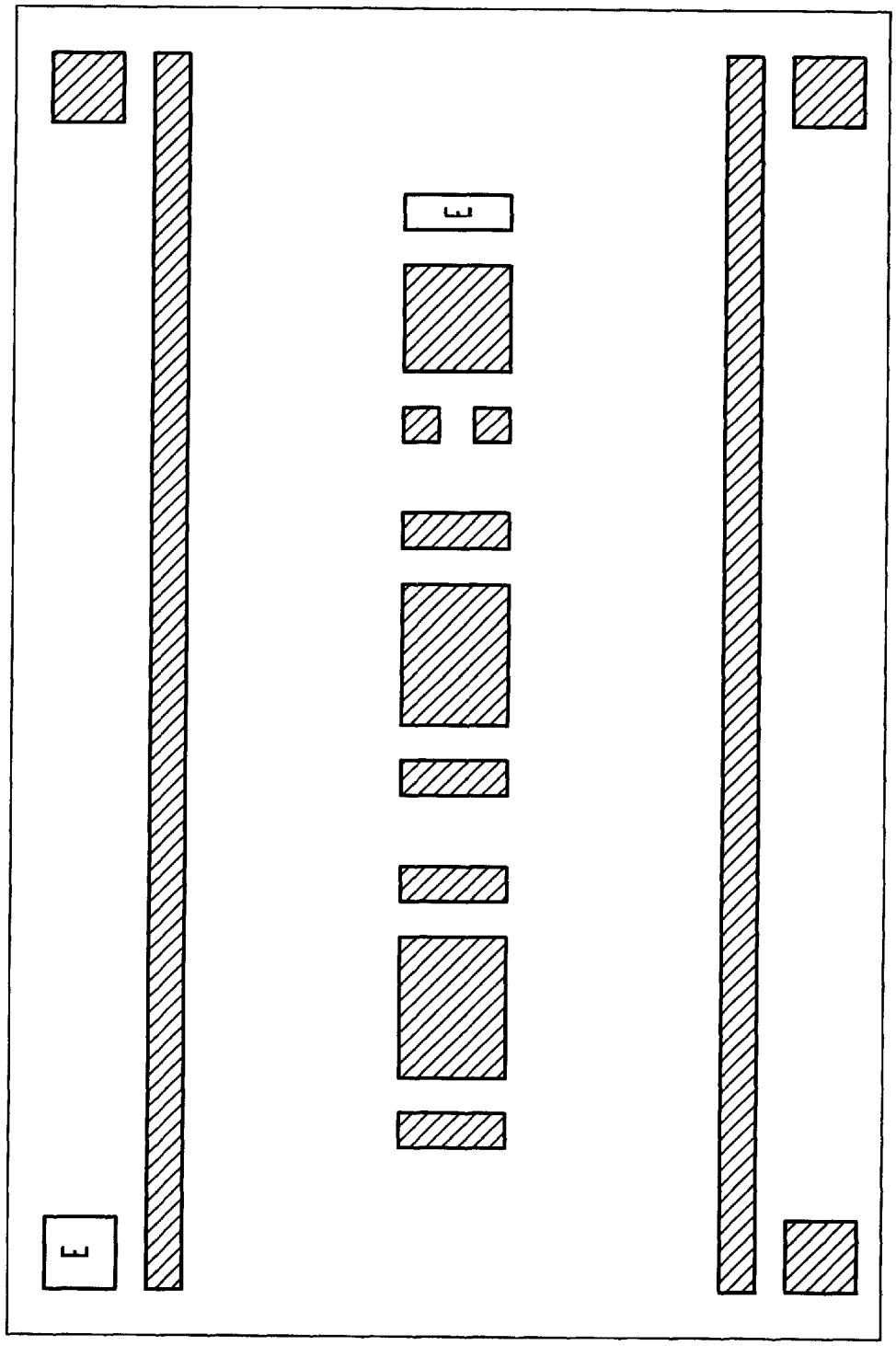
FIG. 6 illustrates the setup used for routing a net E.

FIG. 6 shows a setup for the routing of net E. The nodes on the grid graph touching the shapes of net E become pins of the net. The nodes in the grid graph touching the shapes that do not belong to net E become blockages for this net. The horizontal routing of the net is not allowed to touch a horizontal blockage (shown in black). Similarly, the vertical routing of the net is not allowed to touch a vertical blockage.

Figure 7:
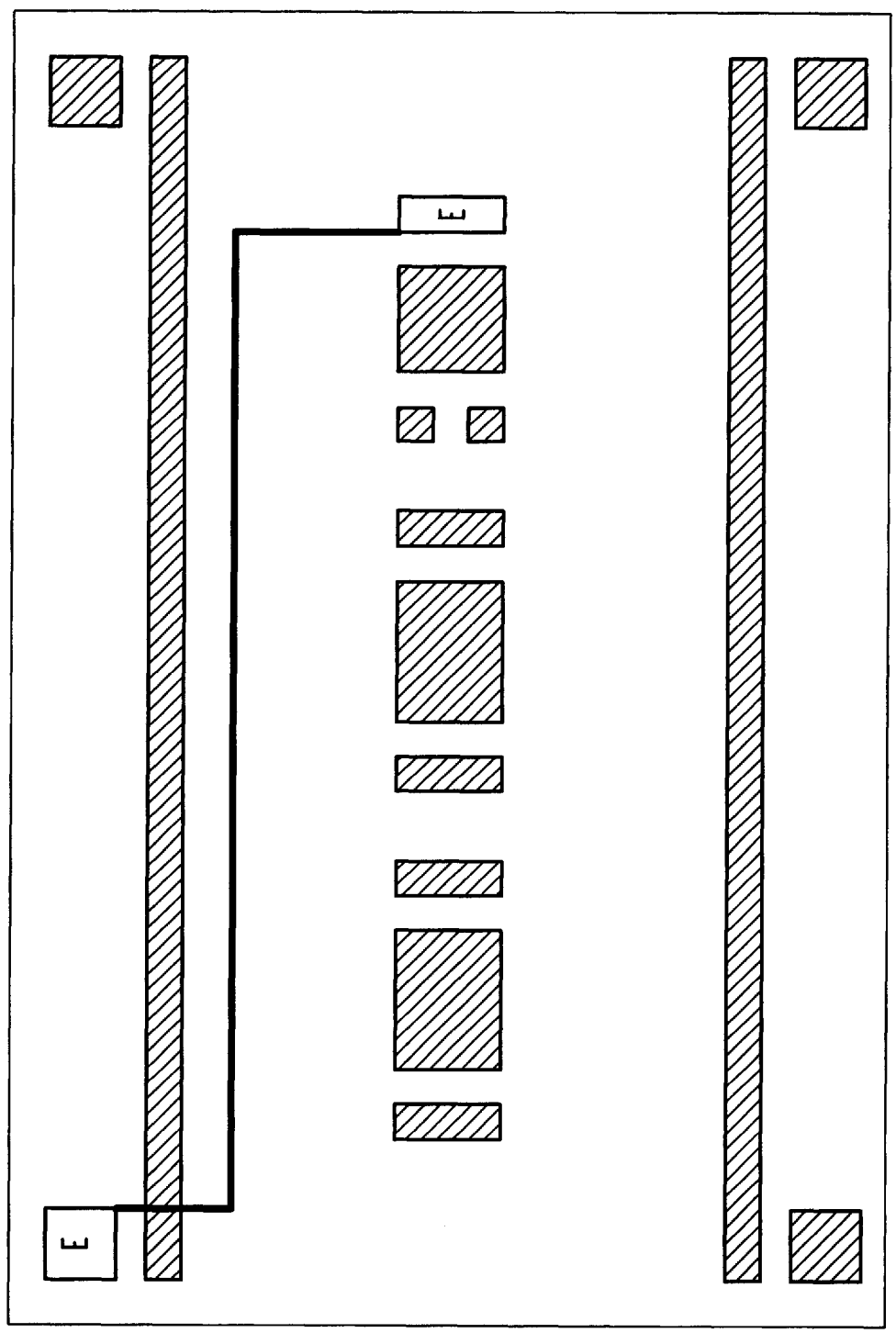
FIG. 7 shows the path resulting from routing the net E.

FIG. 7 shows the path resulting from routing net E. The vertical segments of net E are allowed to cross over the thick lines. It is worth noting that the path of net E runs parallel to the thick line, which affects negatively the yield and increases the capacitance and coupled noise. The length of net E can be obtained by counting the arcs in the grid graph along the path of the routing of net E. This results in 8 vertical arcs+28 horizontal arcs, for a total of 36. Thus, the cost of net E is the sum of the costs of the arcs forming the path. By way of example, assuming the cost of a vertical arc to be 2, and of a horizontal arc to be 1, the horizontal arcs forming the path have a total cost of 28×1=28. Thus, the cost of the path is 16+28=44.

Figure 8:
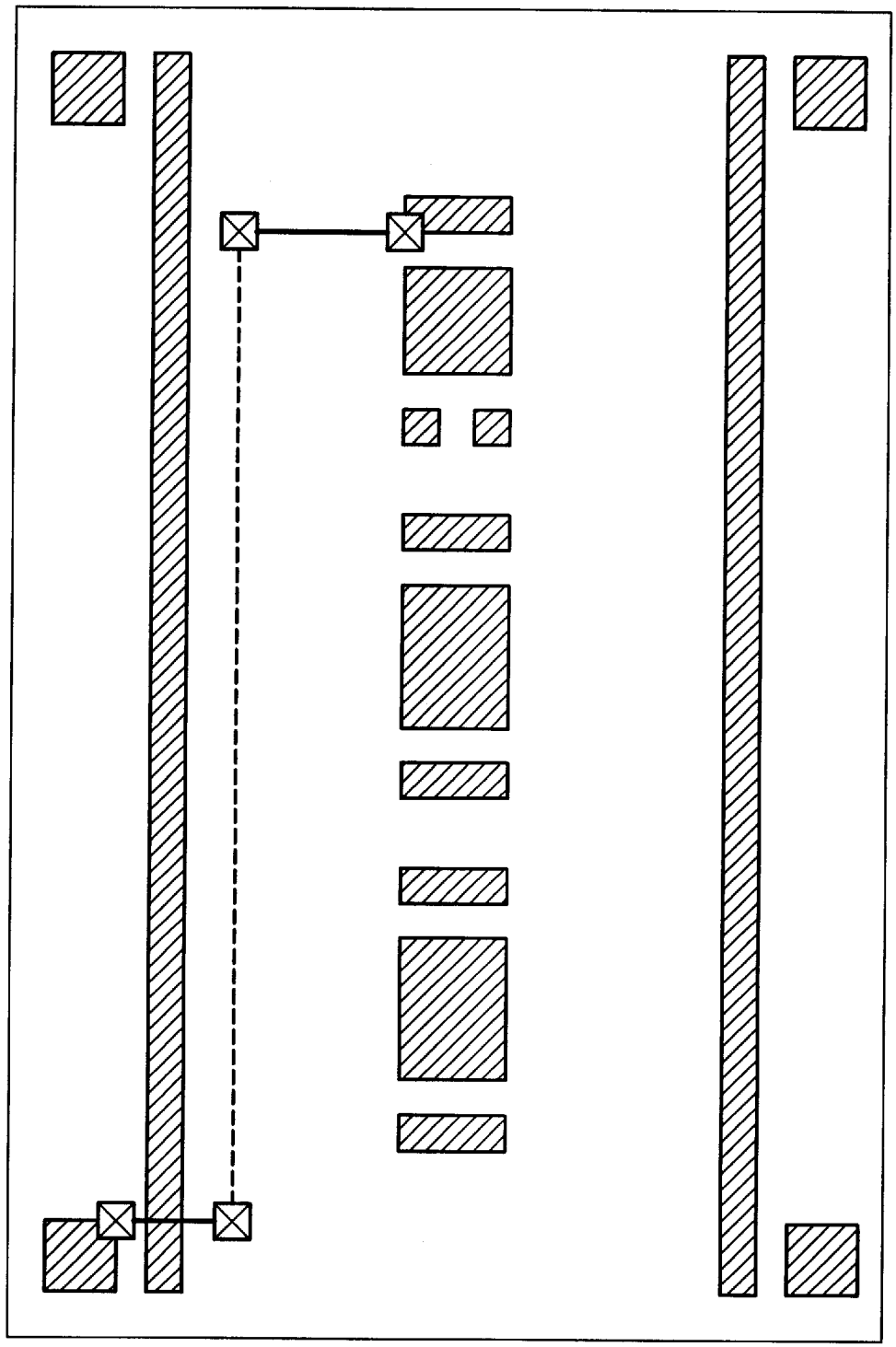
FIG. 8 shows a conversion of the path of net E into wiring and vias in a typical integrated circuit layout.

FIG. 8 shows the wires and the vias resulting from routing net E. The horizontal arcs in the path are converted into wires in the fist personalization plane and the vertical arcs into wires in the second plane. The connections between the two planes become vias (shown as squares with an x inside the shape). The vias represent the up/down connections (z-direction).

Figure 9:
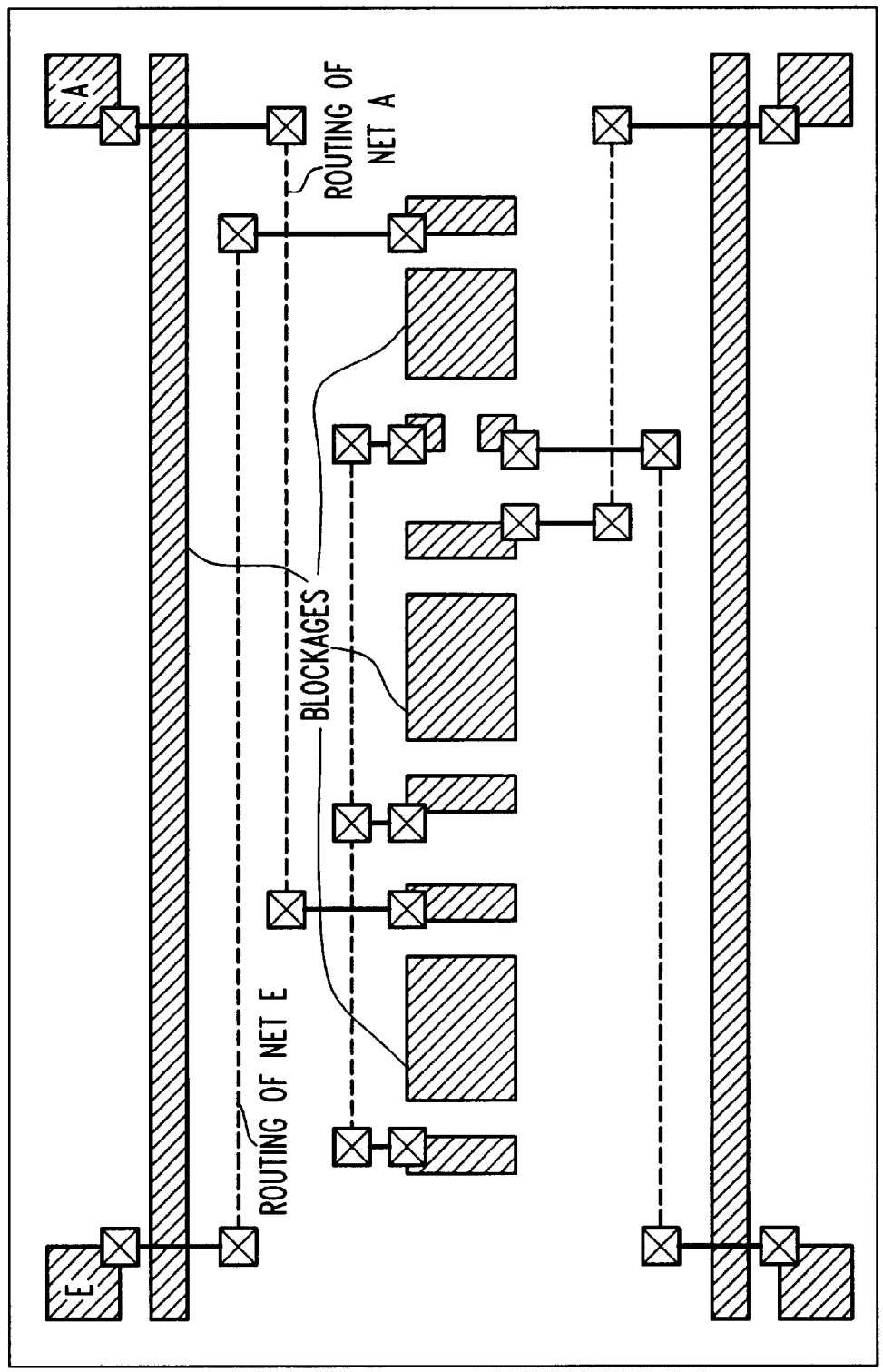
FIG. 9 shows the completed routing of the illustrative integrated circuit.

The completed routing of the sample circuit is shown in FIG. 9. The routing assumes the use of a conventional router. Of particular relevance is the routing of the various nets which run parallel to each other (e.g., nets E and A, net E and blockage, net D and blockage, net B and blockage). Further, the wire length routing cost function does not stop the routing from running alongside each other.

Figure 10:
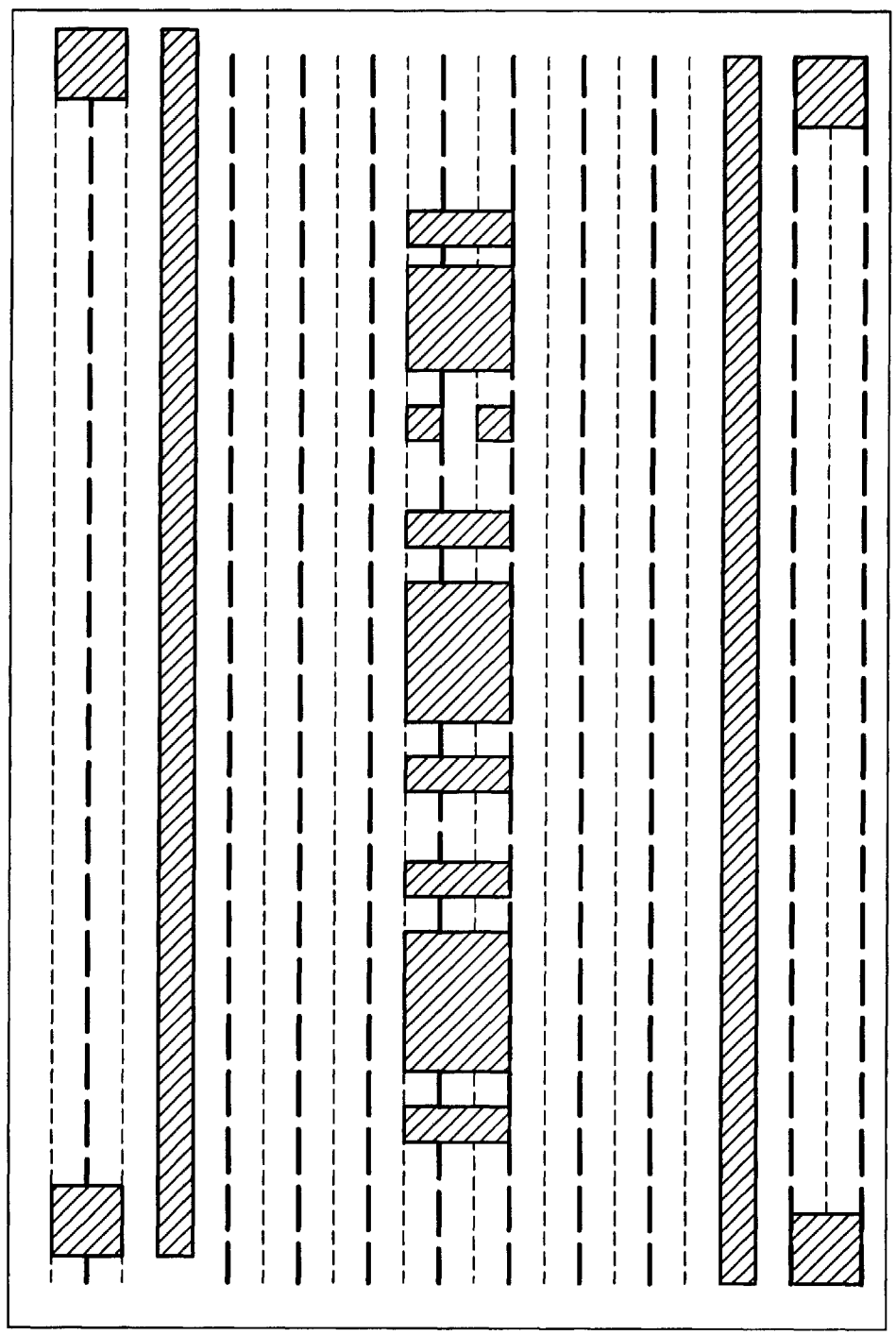
FIG. 10 shows a STRIPE weight assignment for horizontal arcs.
Figure 11:
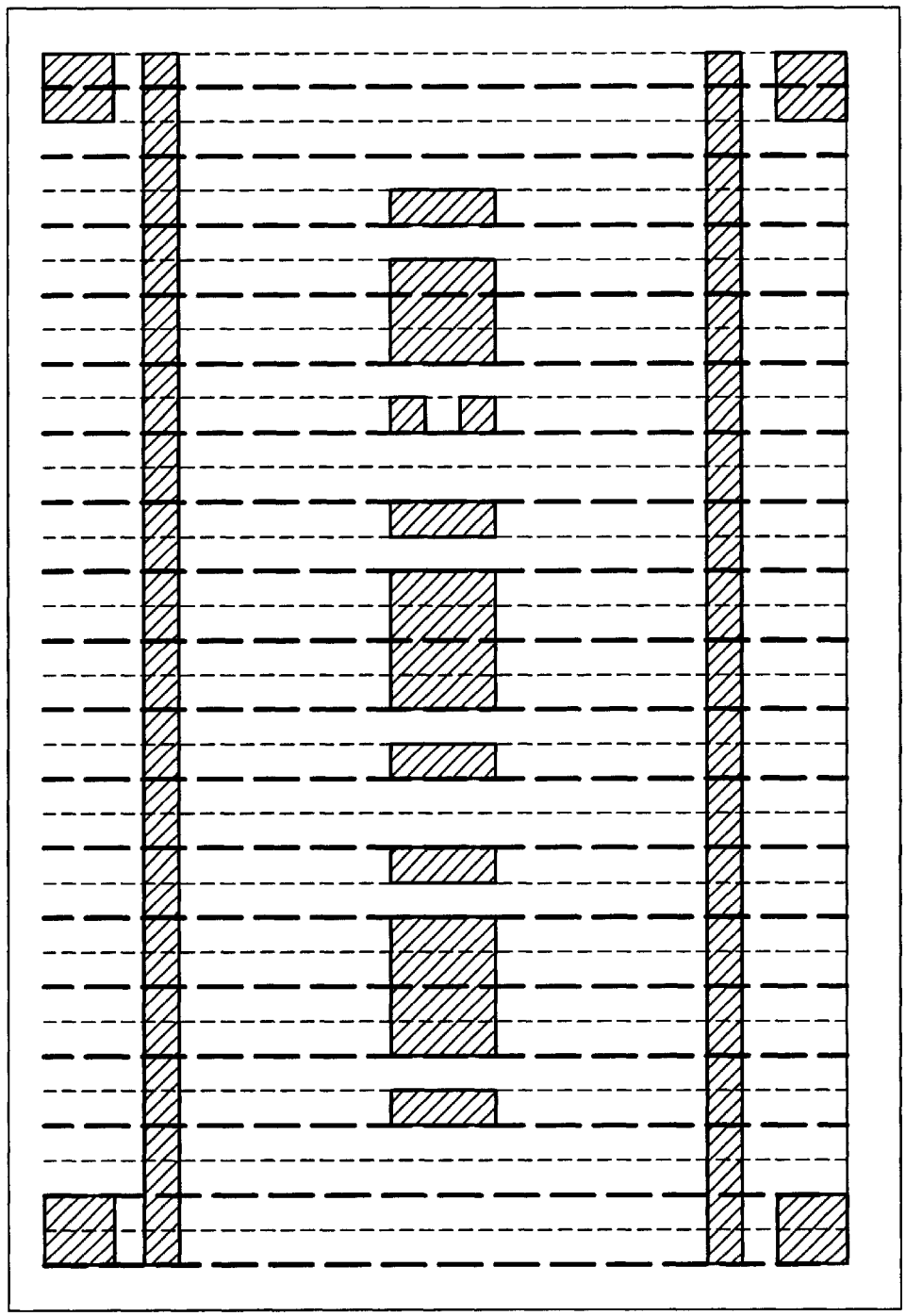
FIG. 11 shows a STRIPE weight assignment for vertical arcs.

FIGS. 10 and 11 illustrate a simplistic version of the STRIPE cost assignment, respectively, for horizontal and for vertical arcs. In FIG. 10, the thick dashed lines indicate horizontal arcs having the high cost of 2; the thin dot-dashed lies indicate a low cost of 1. The assignment as shown is done arbitrarily by alternating high cost and low cost arcs. In FIG. 11, the thick dashed lines illustrate the high cost arcs (e.g., 2), and the thin dot-dashed lines, arcs with a low cost (e.g., 1).

Figure 12:
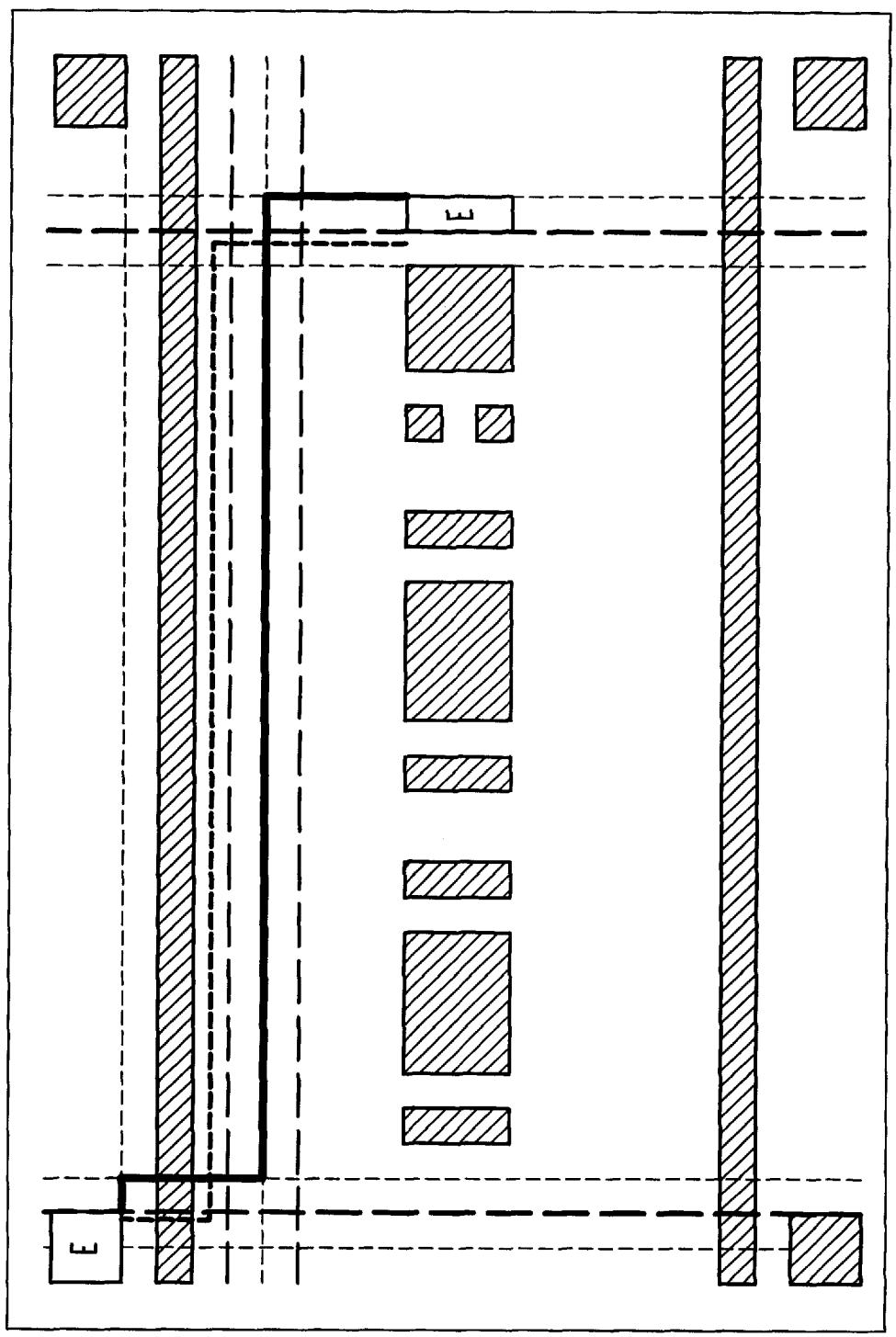
FIG. 12 illustrates the routing of net E with STRIPE costs.

FIG. 12 depicts the routing of net E with STRIPE costs, wherein the old routing of net E is shown as a dashed line. More specifically, the old routing of net E runs through a (thick dashed) horizontal track having a high cost; it further runs through two vertical (thick dashed) high cost tracks. Its total cost is 72. The new routing of net E is shown as a solid black line. It runs through a horizontal (thin dot-dashed) low cost track; further running through two vertical (thin dot-dashed) low cost tracks. Its total cost is 37. [Note that the low cost track assignment causes net E to be spaced away from the (hatched) blockage].

Figure 13:
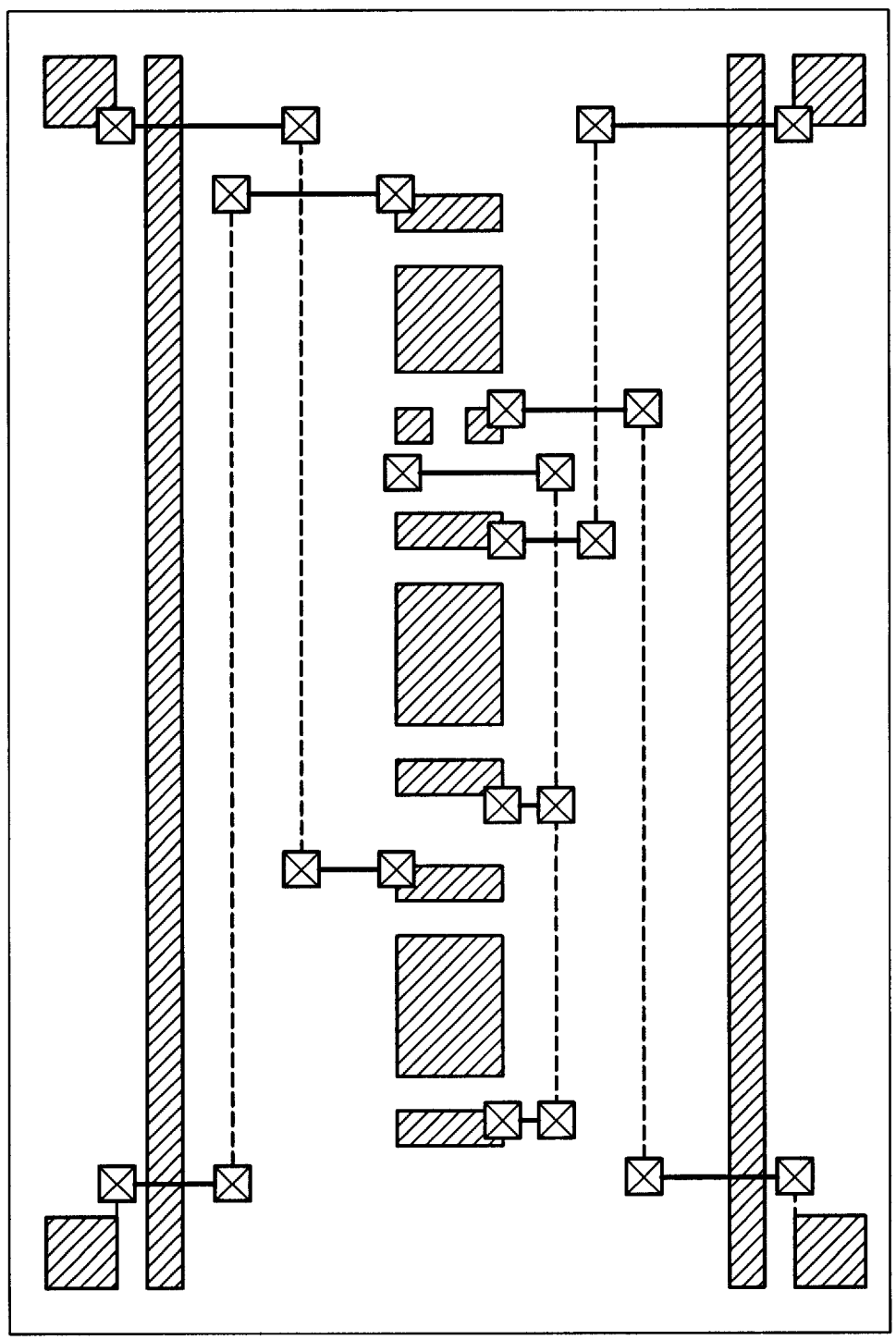
FIG. 13 shows the completed routing of the IC with STRIPE costs.

FIG. 13 shows the completed routing of the integrated circuit using STRIPE costs. In many instances, there is one empty track between the wires. This is a by-product of the STRIPE cost assignment. The extra spacing improves the yield of the integrated circuit.

Figure 14:
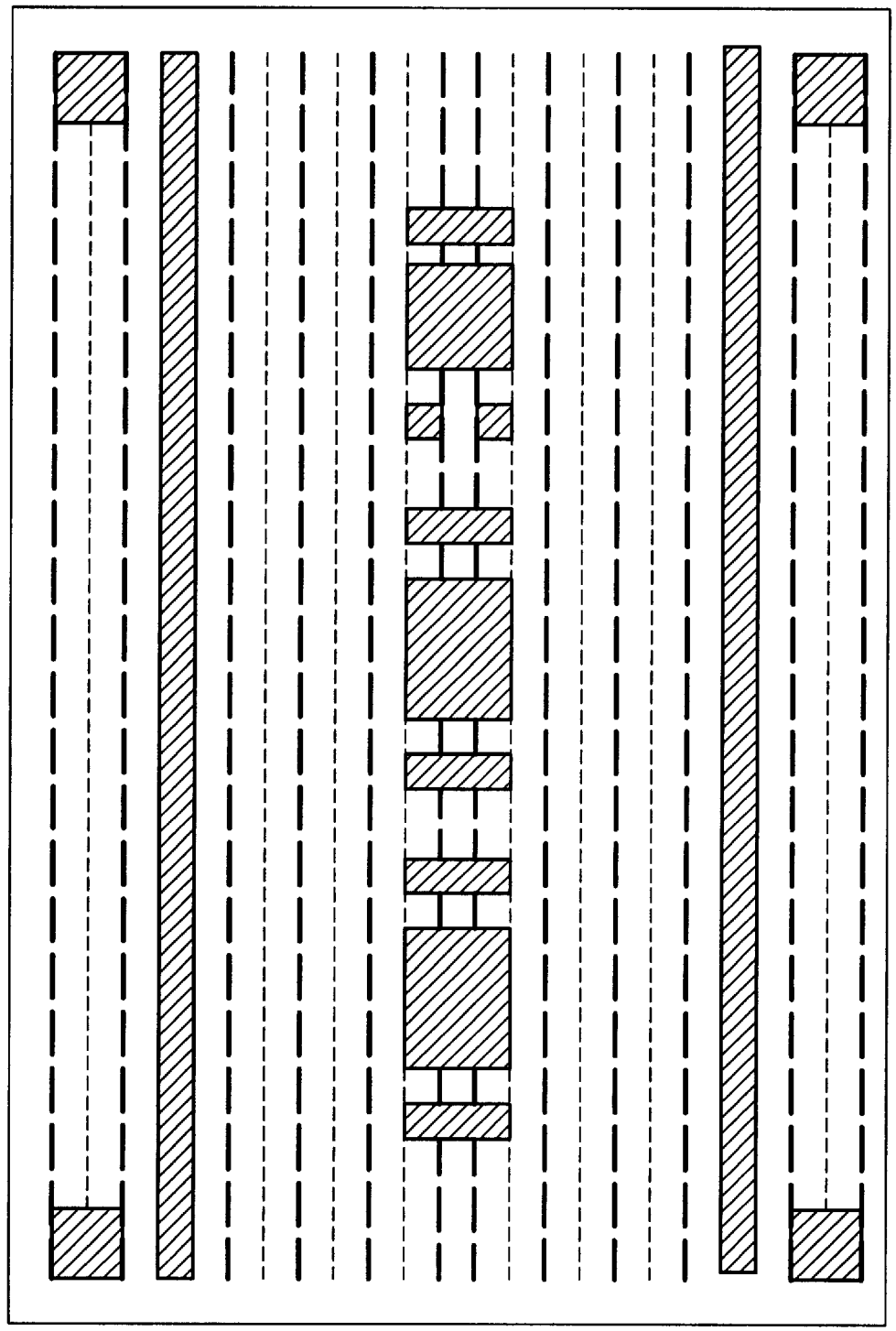
FIG. 14 shows an improved selection of STRIPE weights.

FIG. 14 shows a better selection of the STRIPE's costs. The STRIPE's cost assignment does not have to alternate arbitrarily. In this case, the alternating costs were done starting with high costs at the blockages. This result in a superior cost assignment. Further improvements in the cost assignment can be achieved when using the PAINT method.

Figure 15:
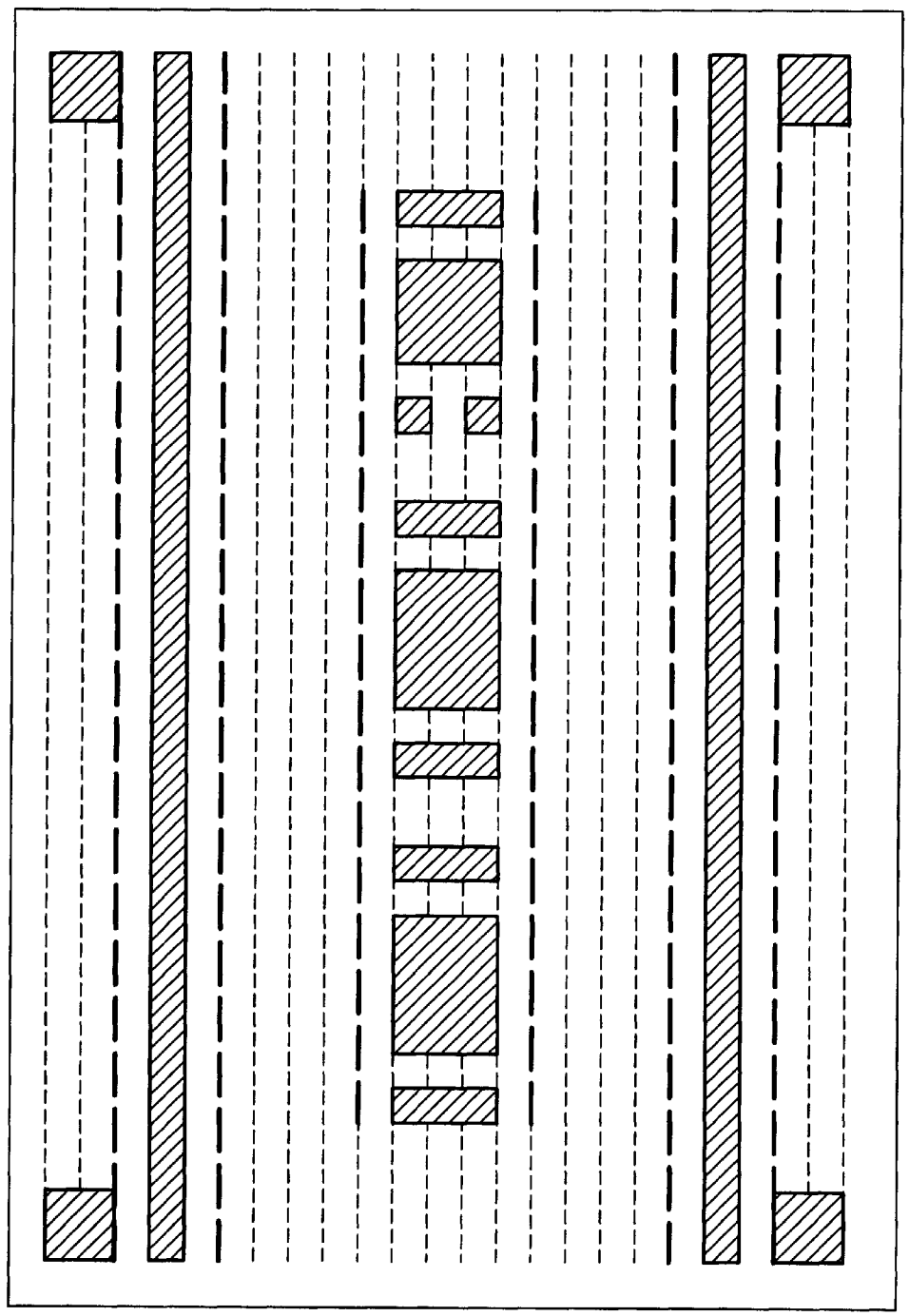
FIG. 15 shows a PAINT method weight assignment for horizontal arcs.
Figure 16:
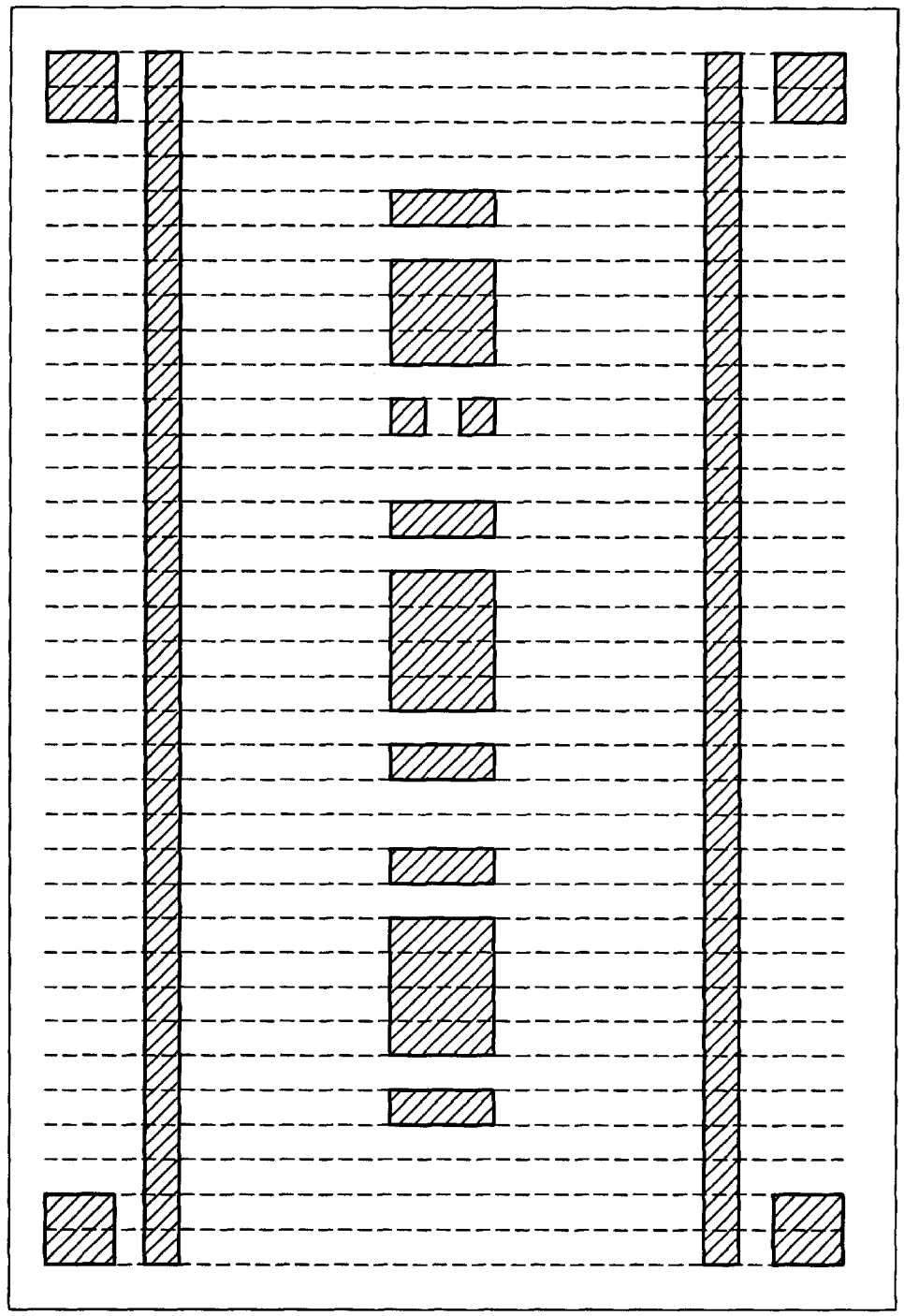
FIG. 16 shows the PAINT method weight assignment for vertical arcs.

FIGS. 15–16 depict the PAINT method cost assignment for horizontal and vertical arcs, respectively. The horizontal arcs adjacent to a (hatched) blockage are allocated a high cost (thick dash). The horizontal arcs with no adjacent (hatched) shapes (blockages) are assigned a low cost (thin dot-dashed). With reference to the PAINT cost allocation for vertical arcs, since there are no vertical blockages, all vertical arcs are ascribed a low cost (thin dot-dashed).

Figure 17:
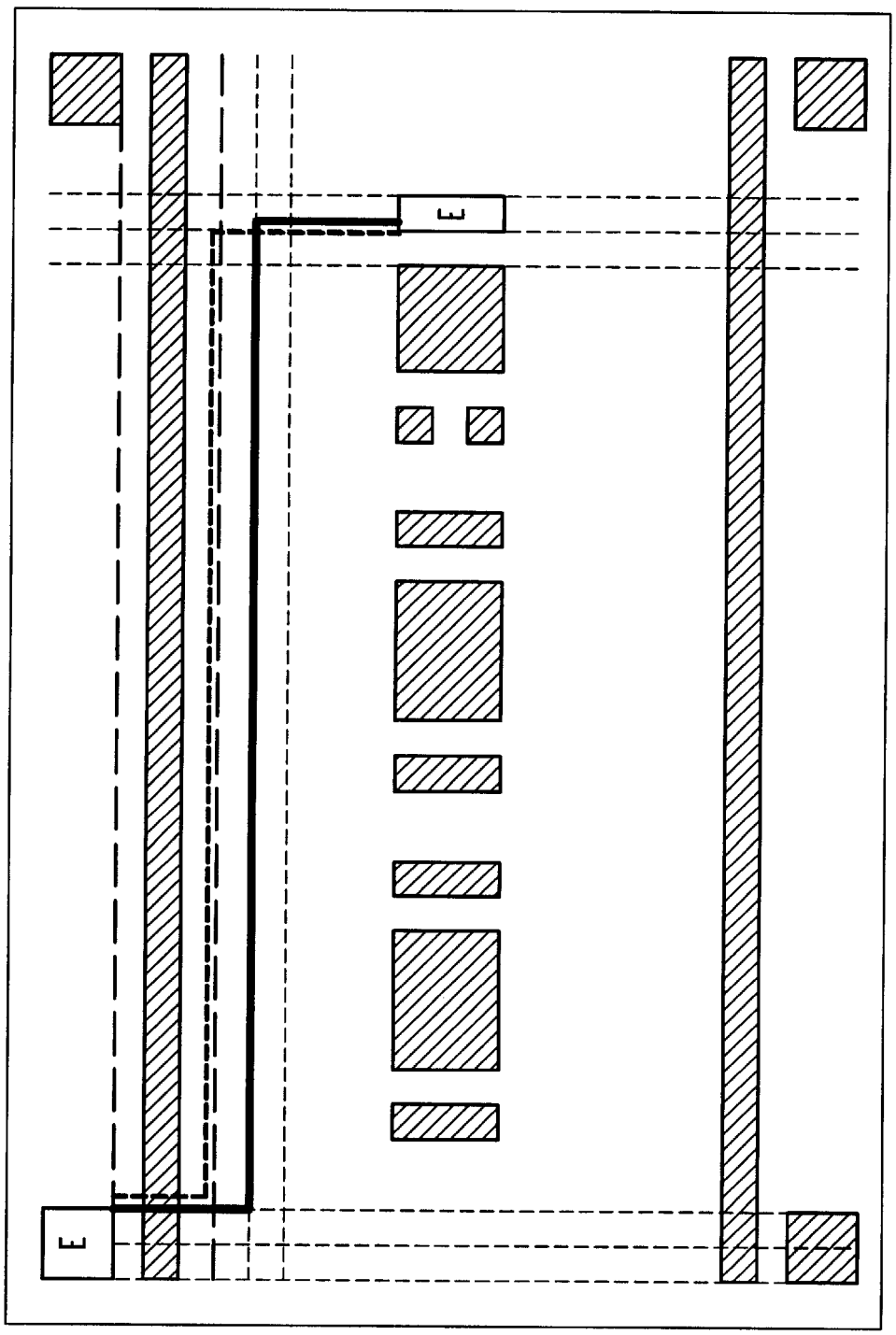
FIG. 17 illustrates the improved routing of net E with PAINT costs.

FIG. 17 shows the routing of net E with PAINT costs. The black line shows the old routing of net E and, more specifically, a run through a (thick dashed) horizontal high cost track. It also runs through two vertical (thin dot-dashed) low cost tracks, for a total cost of 64. The new routing of E runs through a (thick dashed) horizontal low cost track and further, through two vertical low cost tracks, for a total cost of 36. The initial PAINT cost assignment causes the old route next to blockages to be expensive, while the new routing away from the blockages is inexpensive. Thus, the new routing results in an improved yield.

Figure 18:
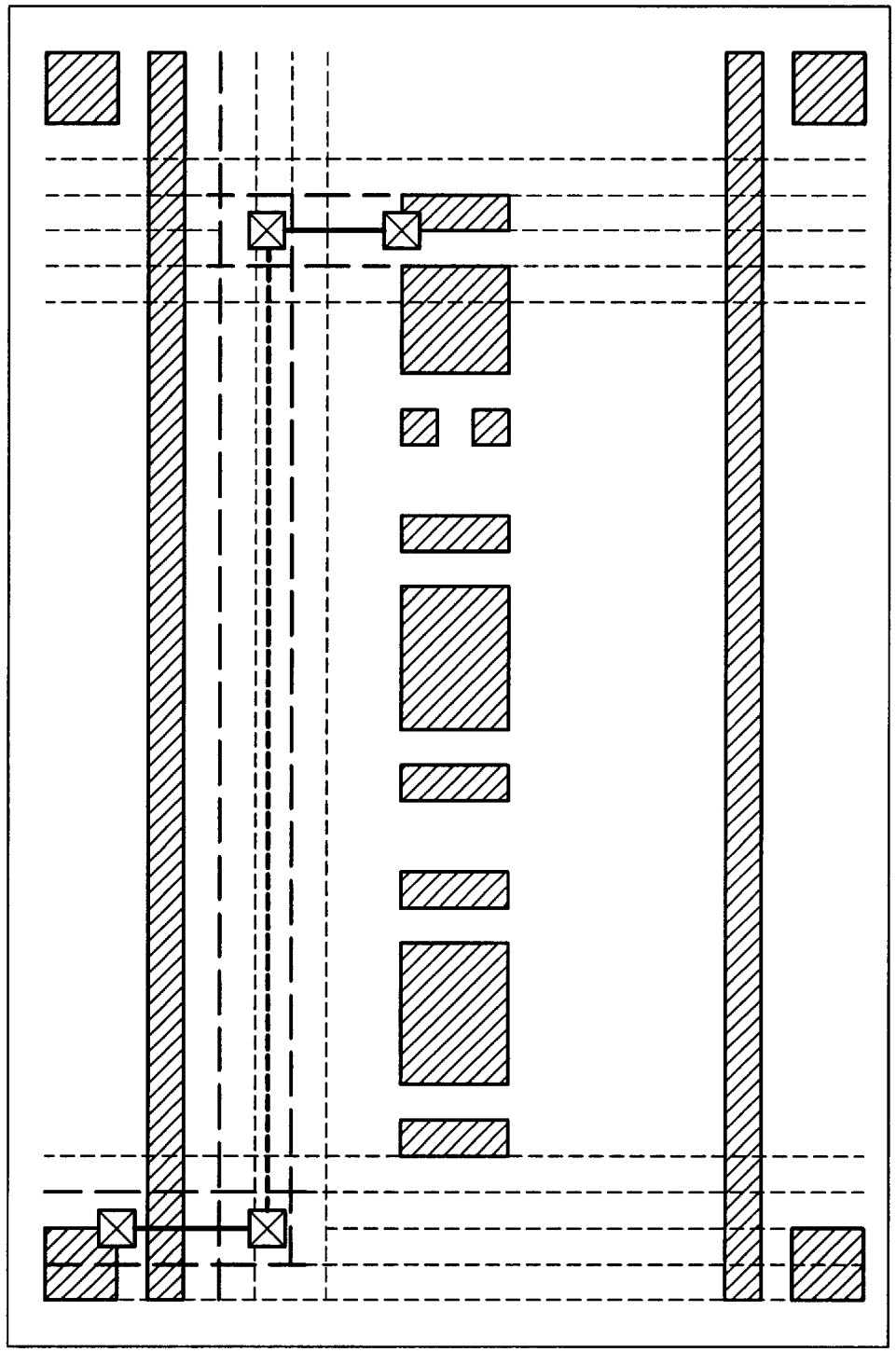
FIG. 18 shows the PAINT cost assignment after routing net E.

FIG. 18 shows the PAINT cost assignments following routing net E—an important improvement over the STRIPE method. FIG. 18 shows the horizontal arcs adjacent to net E being now assigned a high cost (thick dashed). Vertical arcs adjacent to net E are ascribed a high cost (thin dot-dashed). All other arcs retain their previous cost allocations. This new cost assignment causes later routes to be spaced by one track away from net E.

Figure 19:
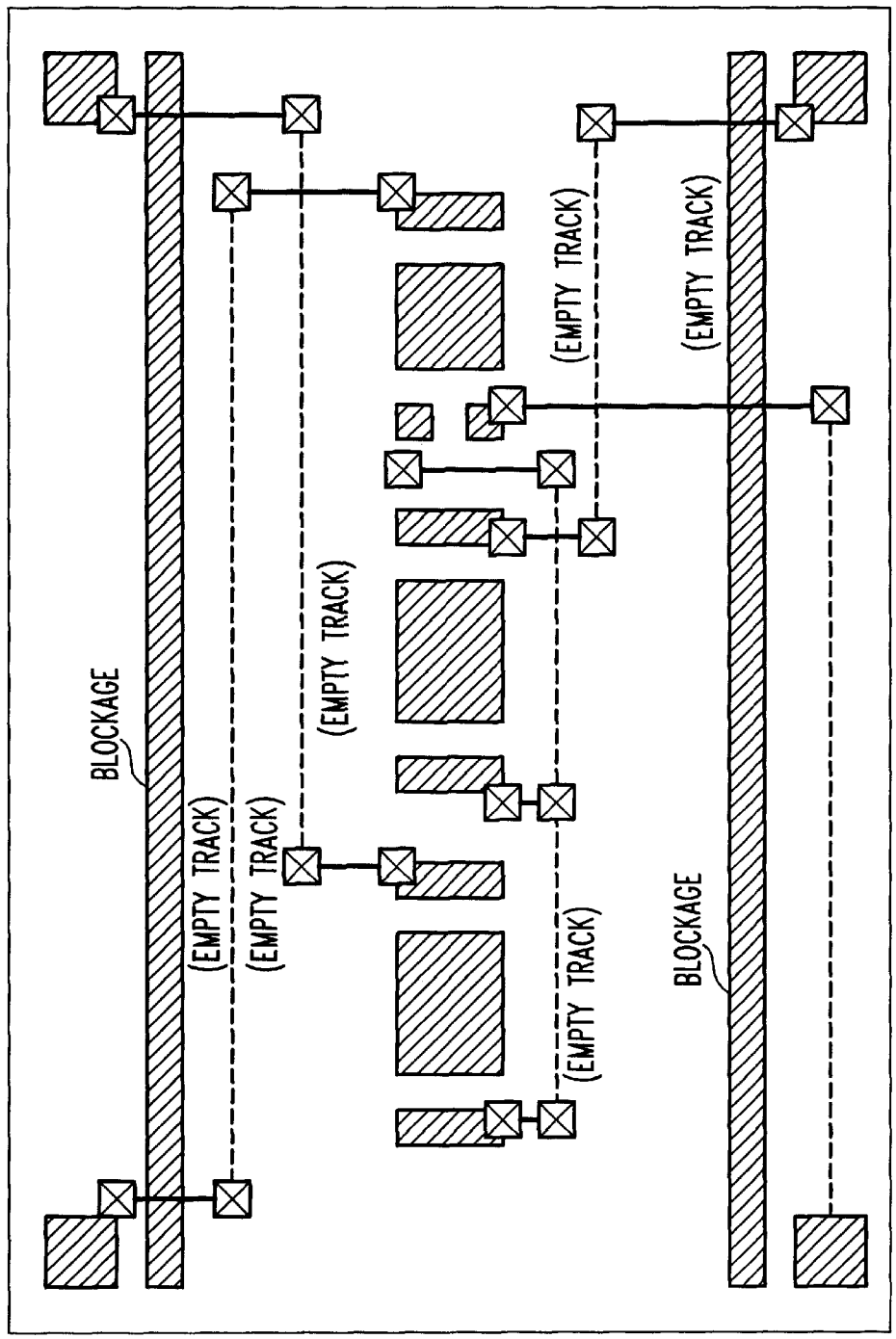
FIG. 19 shows the completed routing of the sample IC using PAINT costs.

FIG. 19 shows the completed routing of the sample integrated circuit using PAINT costs. It is worth noting that all wires have one empty track between each other. In the example, all wires have one empty track with the blockages.

Finally, the above described STRIPE and PAINT methods may be embodied in a hardware environment, typically consisting of a computer, wherein the computer is provided with at least one microprocessor, one or a plurality of DRAMS and SRAM memories, and conventional I/O devices coupled to the microprocessors and memories. Those skilled in the art will recognize that other alternative hardware environments may be used with equally satisfactory results.

Whereas many alterations and modifications of the present invention will no doubt be apparent to a person of ordinary skill in the art after having read the foregoing description, it is to be understood that the particular embodiment shown and described by way of illustration is in no way intended to be considered limiting. Therefore, reference to the detail of the preferred embodiment is not intended to limit the scope of the claims which themselves recite only those features regarded as essential to the invention.

What is claimed is:

1. A method for automatically wiring nets that personalize an integrated circuit chip, module or card while improving yield, reducing capacitance and noise coupling, the method comprising the steps of:

a) converting the integrated circuit chip, module or card into a grid graph and assigning an initial cost to arcs forming the grid graph, the grid graph and the initial cost being suited to a maze router;

b) applying the maze router to provide an initial routing for all the nets on the grid graph and modifying the arc costs after routing each of the nets, the modified arc cost conforming with the maze router;

c) iteratively rerouting with the maze router all the nets on the grid graph and modifying the costs of the arcs until changes in the total cost of the arcs fall below a predetermined threshold; and d) repeating steps a) through c) measuring at the end of each cycle the yield, capacitance, power, or noise coupling to determine if changes in the costs translates into an improvement.

2. The method as recited in step a) of claim 1, further comprising the steps of:

1) selecting VIA, LOW, MEDIUM and HIGH weights;

2) designating favored and non-favored horizontal and vertical tracks;

3) for all of the horizontal tracks, assigning the HIGH weight to all NORTH-SOUTH arcs;

4) for each of the horizontal routing tracks, assigning the LOW weight to all EAST-WEST arcs;

5) for each of the non-favored horizontal routing tracks, assigning the MEDIUM weight to all EAST-WEST arcs;

6) for all vertical tracks, assigning the HIGH weight to all the EAST-WEST arcs;

7) for each of the vertical routing tracks, assigning the LOW weight to all the NORTH-SOUTH arcs;

8) for each of the non-favored vertical routing tracks, assigning the MEDIUM weight to the all NORTH-SOUTH arcs; and 9) routing of all nets with the assigned weights.

3. The method as recited in step a) of claim 1 further comprising the step of:

1) selecting VIA, LOW, MEDIUM and HIGH weights;
2) for all the horizontal tracks, assigning the HIGH weight to all NORTH-SOUTH arcs and the LOW weight to all EAST-WEST arcs;
3) for all the vertical tracks, assigning the LOW weight to all the NORTH-SOUTH arcs and the HIGH weight to all the EAST-WEST arcs;
4) for each grid location on a horizontal track, adjacent to a blockage, assigning the MEDIUM weight to all the EAST-WEST arcs; and
5) for each grid location on a vertical track, adjacent to a blockage, assigning the MEDIUM weight to all the NORTH-SOUTH arcs.

4. The method as recited in step b) of claim 1, further comprising the step of:
1) blocking the locations covered by the routed net;
2) for each grid location on a horizontal track adjacent to a newly blocked location, assigning the MEDIUM weight to all the EAST-WEST arcs; and
3) for each grid location on a vertical track, adjacent to a new blockage, assigning the MEDIUM weight to all the NORTH-SOUTH arcs.

5. The method as recited in claim 2 further comprising the step of:
1) iteratively selecting each of the routed nets and removing all the paths from the selected routed nets of the grid graph;
2) rerouting the selected routed nets that were removed; and
3) iteratively rerouting with the maze router all the nets of the grid graph and modifying the costs of the arcs until changes in the total cost of the arcs falls below a predetermined threshold.

6. The method as recited in claim 3 further comprising the steps of:
1) iteratively selecting each of the routed nets and removing all the paths from the selected routed nets of the grid graph;
2) deblocking the grid locations belonging to the paths of the selected routed net;
   2a) for each of the deblocked grid locations and for each of its adjacent ones, assigning the HIGH weight to all the NORTH-SOUTH arcs and the LOW weight to the EAST-WEST arcs, if the deblocked grid locations or its adjacent ones lies on a horizontal track;
   2b) for each of the deblocked grid locations and for each of its adjacent ones, assigning the HIGH weight to all the EAST-WEST arcs and the LOW weight to the NORTH-SOUTH arcs, if the deblocked grid locations or its adjacent ones lies on a vertical track;
   2c) for each of the deblocked grid locations and for each of its adjacent ones, assigning the MEDIUM weight to all the EAST-WEST arcs if the deblocked grid locations or its adjacent ones lie on a horizontal track which is also next to a blocked grid location;
   2d) for each of the deblocked grid locations and for each of its adjacent ones, assigning the MEDIUM weight to all the NORTH-SOUTH arcs if the deblocked grid locations or its adjacent ones lies on a vertical track which is also next to a blocked grid location;
3) rerouting the selected routed net that was removed;
   3a) blocking the locations covered by the routed net;
   3b) for each grid location adjacent to a newly blocked location on a horizontal track, assigning the MEDIUM weight to all the EAST-WEST arcs;
   3c) for each grid location adjacent to a new blockage and on a vertical track, assigning the MEDIUM weights to all the NORTH-SOUTH arcs; and
4) iteratively rerouting with the maze router all the nets on the grid graph and modifying the costs of the arcs until changes in the total cost of the arcs falls below a predetermined threshold.

7. The method as recited in step d) of claim 1 further comprising the steps of:
a) selecting an initial set of VIA, LOW, MEDIUM, HIGH weights;
b) routing with a maze router the integrated circuit chip, module or card;
c) determining yield, capacitance or noise coupling values of the routed integrated circuit chip;
d) selecting one of the previously selected weights,
   d1a) increasing or decreasing the selected routing weight;
   d1b) applying the selected routing weights to all the arcs in the grid graph;
   d1c) using the increased or decreased routing weight, rerouting with the maze router the integrated circuit chip, module or card;
   d1d) recomputing the yield, capacitance or noise coupling for the new routing;
   d1e) comparing the recomputed values with the previously best result obtained, keeping the rerouted integrated circuit chip and weight combination resulting in the best yield, capacitance and coupling noise; and
e) repeating step d) until no further improvement is detected.

8. A method for automatically wiring nets that personalize an integrated circuit chip, module or card while improving yield, reducing capacitance and noise coupling, the integrated circuit chip, module or card being converted into a grid graph and an initial cost being assigned to arcs forming the grid graph, the grid graph and the initial cost being suited to a maze router, the method being characterized by the steps of:
a) applying the maze router to provide an initial routing for all the nets on the grid graph and modifying the arc costs after routing each of the nets, the modified arc cost conforming with the maze router;
b) iteratively rerouting with the maze router all the nets on the grid graph and modifying the costs of the arcs until changes in the total cost of the arcs fall below a predetermined threshold; and
c) repeating steps a) and b) measuring at the end of each cycle the yield, capacitance, power, or noise coupling to determine if changes in the costs translates into an improvement.

9. A computer program product for automatically wiring nets that personalize an integrated circuit chip, module or card while improving yield, reducing capacitance and noise coupling, comprising:
a) computer readable program code means for causing a computer to convert the integrated circuit chip, module or card into a grid graph and to assign an initial cost to arcs forming the grid graph, the grid graph and the initial cost being suited to a maze router;
b) computer readable program code means for causing a computer to apply the maze router to provide an initial routing for all the nets on the grid graph and to modify the arc costs after routing each of the nets, the modified arc cost conforming with the maze router;

c) computer readable program code means for causing a computer to iteratively reroute with the maze router all the nets on the grid graph and to modify the costs of the arcs until changes in the total cost of the arcs fall below a predetermined threshold; and d) computer readable program code means for causing a computer to repeat steps a) through c), measuring at the end of each cycle the yield, capacitance, power, or noise coupling to determine if changes in the costs translates into a predefined improvement.

10. A program storage device readable by a machine, tangibly embodying a program of instructions executable by the machine to perform method steps for automatically wiring nets that personalize an integrated circuit chip, module or card while improving yield, reducing capacitance and noise coupling, the method comprising the steps of:

a) converting the integrated circuit chip, module or card into a grid graph and assigning an initial cost to arcs forming the grid graph, the grid graph and the initial cost being suited to a maze router;

b) applying the maze router to provide an initial routing for all the nets on the grid graph and modifying the arc costs after routing each of the nets, the modified arc cost conforming with the maze router;

c) iteratively rerouting with the maze router all the nets on the grid graph and modifying the costs of the arcs until changes in the total cost of the arcs fall below a predetermined threshold; and d) repeating steps a) through c) measuring at the end of each cycle the yield, capacitance, power, or noise coupling to determine if changes in the costs translates into an improvement.

* * * * *